United States Patent
Lee et al.

(10) Patent No.: US 9,129,826 B2
(45) Date of Patent: Sep. 8, 2015

(54) EPOXY BUMP FOR OVERHANG DIE

(75) Inventors: Hun Teak Lee, Ichon-si (KR); Jong Kook Kim, Jungja-dong (KR); Chul Sik Kim, Ichon-si (KR); Ki Youn Jang, Incheon (KR)

(73) Assignee: STATS ChipPAC Ltd., Singapore (SG)

( * ) Notice: Subject to any disclaimer, the term of this patent is extended or adjusted under 35 U.S.C. 154(b) by 387 days.

(21) Appl. No.: 11/420,853

(22) Filed: May 30, 2006

(65) Prior Publication Data

US 2006/0267609 A1    Nov. 30, 2006

Related U.S. Application Data

(60) Provisional application No. 60/686,116, filed on May 31, 2005.

(51) Int. Cl.
*H01L 29/06* (2006.01)
*H01L 25/065* (2006.01)
*H01L 23/00* (2006.01)

(52) U.S. Cl.
CPC ............ *H01L 25/0657* (2013.01); *H01L 24/32* (2013.01); *H01L 24/78* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/78301* (2013.01); *H01L 2225/0651* (2013.01); *H01L 2225/06555* (2013.01); *H01L 2225/06562* (2013.01); *H01L 2225/06575* (2013.01); *H01L 2924/01013* (2013.01); *H01L 2924/01033* (2013.01); *H01L 2924/01082* (2013.01); *H01L 2924/07802* (2013.01); *H01L 2924/15311* (2013.01)

(58) Field of Classification Search
CPC .............. H01L 23/4012; H01L 25/043; H01L 25/0657; H01L 25/0756; H01L 25/117
See application file for complete search history.

(56) References Cited

U.S. PATENT DOCUMENTS

| | | | |
|---|---|---|---|
| 6,340,846 B1 | 1/2002 | LoBianco et al. | |
| 6,593,662 B1 | 7/2003 | Pu et al. | |
| 6,885,093 B2 * | 4/2005 | Lo et al. ......... | 257/686 |
| 6,927,479 B2 | 8/2005 | Ramakrishna | |
| 6,930,378 B1 * | 8/2005 | St. Amand et al. ........ | 257/686 |
| 7,067,927 B1 | 6/2006 | Mostafazadeh | |
| 7,078,264 B2 | 7/2006 | Yang | |
| 7,132,311 B2 | 11/2006 | Akiba et al. | |
| 7,161,249 B2 | 1/2007 | Shim et al. | |

(Continued)

FOREIGN PATENT DOCUMENTS

| | | |
|---|---|---|
| TW | 200303607 | 9/2003 |
| TW | 200422327 | 11/2004 |

OTHER PUBLICATIONS

Office Action for KR Application No. 49218-2006 dated May 31, 2013.

(Continued)

*Primary Examiner* — Kyoung Lee (74) *Attorney, Agent, or Firm* — Ishimaru & Associates LLP (57) ABSTRACT

In a semiconductor assembly having stacked elements, discrete bumps made of a polymer such as an electrically non-conductive epoxy are interposed between the upper surface of a substrate and the lower surface of the overhanging part of an elevated element (die or package) with the discrete bump directly under bond sites on the elevated element.

17 Claims, 6 Drawing Sheets

(56) References Cited

U.S. PATENT DOCUMENTS

| | | |
|---|---|---|
| 2003/0038374 A1* | 2/2003 | Shim et al. .................. 257/777 |
| 2003/0045029 A1 | 3/2003 | Emoto |
| 2004/0195591 A1 | 10/2004 | Gehman et al. |
| 2004/0212096 A1 | 10/2004 | Wang |
| 2004/0262774 A1 | 12/2004 | Kang et al. |

OTHER PUBLICATIONS

Office Action for Taiwan Application No. 095119442 dated Oct. 8, 2014.

* cited by examiner

EPOXY BUMP FOR OVERHANG DIE

CROSS REFERENCE TO RELATED APPLICATION

This application claims priority from U.S. Provisional Application No. 60/686,116, filed May 31, 2005, titled "Epoxy bump for overhang die".

BACKGROUND

This invention relates to stacked die semiconductor packages and stacked semiconductor package modules.

A conventional chip package consists of a semiconductor die affixed to a surface of a substrate and electrically interconnected to bonding pads on the substrate surface. The opposite surface of the substrate has an array of solder balls for electrical connection to, for example, a motherboard. The substrate includes, among other things, routing circuitry for mediating appropriate connection between the die and the motherboard. The die and associated interconnection parts are encapsulated with a protective molding.

The die may be affixed with its "active surface" upward, and is then conventionally interconnected by so-called "wire bonding", in which conductive wires are connected from points on the active surface of the die to the bond pads on the die attach ("upper") surface of the substrate.

Figure 1A:
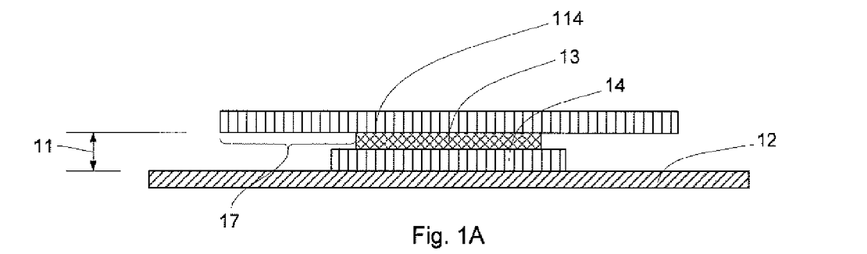
FIG. 1A is a diagrammatic sketch in a sectional view showing a die mounted on a spacer over a lower die on a substrate, showing portions of the second die overhanging the substrate.
Figure 1B:
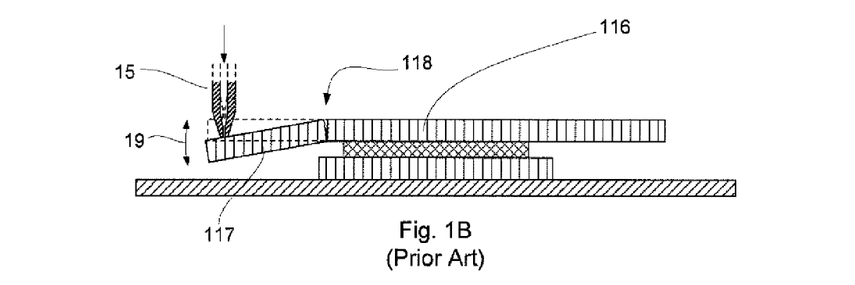
FIG. 1B is a diagrammatic sketch in a sectional view showing crack or breakage, or bending or bouncing of an overhanging portion of an upper stacked die as shown in FIG. 1A, as can occur during a wire bonding operation.

To increase the capacity and performance of the package, a die may be stacked upon a die, to make a stacked die package. A portion of the active surface of the lower die (typically, for example, a peripheral marginal area) is occupied by the wire bonds (the "wire span" area), and no solid piece can be placed directly upon the wire span area. An upper die that is small enough may be placed directly upon another area of the active surface of the lower die (typically, for example, a central region). However, where an upper die is too large to fit within the available region of the lower die, a small sufficiently thick solid spacer (such as a chip of silicon or glass) may be placed directly on the available region of the lower die, and the upper die is then stacked upon the spacer, as shown in FIG. 1A. Part of the upper die overhangs, and this part may crack or break (destroying the electronics in the die), as shown in FIG. 1B, when the overhanging part is loaded (as, for example, during the wire bond process, when the capillary contacts the die). Or, where the die is very thin and the overhang is extensive, the overhanging portion may not crack or break, but may flex excessively during the wire bonding procedure, resulting in unacceptable bonds at the die pads.

Alternatively, to increase capacity and performance, a second package may be stacked upon a die (or upon a lower package) to make a stacked package module. Where a spacer is required, or where the second package is spaced asymmetrically over the die or lower package or over the spacer, part of the upper package overhangs. The overhanging part of the upper package may crack or break or, as may be more likely, the upper package may "tilt" when the overhanging part is loaded.

One way to prevent such breakage or tilt is to provide a support for the overhanging part of the upper die or package.

A conventional way to support the overhang is to provide solid insulating spacers upon the lower substrate, peripheral to the lower die. Another conventional way to support the overhang is to provide solid insulating spacers upon the lower die, within the available region of the active side of the die.

SUMMARY

This invention is directed to providing support for a die or a package that overhangs a package substrate, and thereby preventing mechanical failure (cracking or breaking) or tilt. The overhanging feature (die or package) is stacked upon one or more of a die or a package or a spacer, and has a portion that overhangs the surface of the substrate on which the stacked features are mounted. According to the invention, discrete bumps made of a polymer (such as an electrically nonconductive epoxy) are interposed between the upper surface of the substrate and the lower surface of the overhanging part of the die or package. The bumps are dimensioned to provide a clearance between the upper surface of the "bottom" substrate and the under surface of the second die or "top" substrate.

The invention is carried out by first determining what height is required for the support; then depositing one or more of the polymer bumps at one or more suitable sites on the substrate; and placing the overhanging die or package onto the feature or features upon which it is stacked. The required height is the same as the accumulated thickness of the feature or features upon which the die or package is stacked (including the sum of thicknesses of, for example, any die, packages, spacers, adhesives layers, etc.). Suitable sites for the bumps are determined according to the extent and position of the features or features upon which the die or package is stacked, the extent of the overhang, and the type and force of any stresses that may be imposed on the die or package during processing.

The bumps have a base where they contact the substrate, which may have a greater and lesser width. The greater width of the bump base is in some embodiments less than ten times the bump height, or in some embodiments less than four times the bump height, or in some embodiments less than two times the bump height; and or in some embodiments the greater width of the bump base is less than the bump height. In preferred bumps the base has a generally round, for example, generally circular, shape; and preferred bumps have a generally round, for example generally circular, shape in sectional views generally parallel to the substrate. Various bump shapes may be suitable. The bump may be narrower at greater distances away from the base, although the base may not necessarily be the widest part of the bump.

The invention can be employed using standard equipment, such as for example a conventional die attach machine and die attach epoxy dispenser. The polymer bumps are applied during placement of the overhanging die or package, and may be made as a part of the step of dispensing the die attach adhesive onto the features upon which the die or package is stacked.

In one aspect the invention features a semiconductor assembly having a semiconductor part, such as a package or a die, mounted in an elevated position in relation to an assembly substrate, in which an overhang of the elevated part (die or package) is supported by one or more polymer bumps.

The stacked feature may be a die, or may be a package including a die mounted onto and electrically interconnected with, an upper package substrate. The stacked feature may be electrically interconnected to the assembly substrate by wire bonds; where the feature is a die, the wire bonds connect pads on the die with bond sites (for example on leads or bond fingers) in the assembly substrate, and where the stacked features is a package, the wire bonds connect bond sites (for example on leads or bond fingers) on the upper package substrate with bond sites (for example on leads or bond fingers) in the assembly substrate.

In some embodiments the stacked feature is stacked over a first die. The first die may be affixed to a die mount region of a die attach side of the assembly substrate, with the active side facing away from the assembly substrate, and electrically interconnected to the substrate by wire bonds connecting pads on the first die with bond sites (for example on leads or bond fingers) in the assembly substrate. Or, the first die may be mounted to a die mount region of a die attach side of the assembly substrate in flip chip fashion, in which the die is mounted with the active side facing the substrate and electrical interconnection is made by conductive balls or bumps attached to pads on the die and to interconnect sites on the die attach region of the substrate.

In another aspect the invention features a method for making a semiconductor assembly, by mounting a first die on an assembly substrate, mounting a die spacer using an adhesive on the first die, depositing discrete epoxy bumps on the assembly substrate, interconnecting the first die onto the assembly substrate, and mounting a second ("stacked") die or ("top") package upon the die spacer using an adhesive and upon the bumps. The bumps are dimensioned to provide a clearance between an upper surface of the assembly substrate and a lower surface of the second die or "top" package. Further, the second die or "top" package is interconnected onto the bottom substrate by wire bonds connecting pads on the second die (or bond sites on the "top" package substrate) with bond sites on the assembly substrate. In some embodiments the first die is electrically connected to the assembly substrate by wire bonds connecting pads on the first die with bond sites on the substrate; in other embodiments the first die is electrically connected to the assembly substrate in a flip chip manner.

The invention can be useful in semiconductor packaging and, particularly, in Multi Chip Package ("MCP") or System in Package ("SiP") or Multi Package Module ("MPM") package configurations. It can be used, for example, in computers, in telecommunications, and in consumer and industrial electronics.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Terms such as "top", "bottom", "upper", "lower", "over", "above" and the like are employed with reference to the relative positions of the various parts in the assemblies as shown in the FIGs., and it will be understood that the assemblies can be deployed in any orientation.

Referring now to FIG. 1A, there is shown a stacked die configuration having a first ("lower") die 14 mounted on a substrate 12, a spacer 13 mounted on the lower die 14, and a second ("upper") die 114, larger than the first die 14, mounted upon the spacer 13. The lower die can be affixed to the substrate using a die attach adhesive, the spacer (which may be, for example, a "dummy" die or a chip of glass) can be mounted on the lower die using an adhesive such as a die attach adhesive, and the upper die can be mounted on the spacer using a die attach adhesive (the various adhesives are not shown in the FIGs.). The lower die in this example is electrically interconnected with the substrate by wire bonds (not shown in the FIG.) prior to mounting the larger upper die. Any or all of the die attach adhesives may be, for example, a die attach epoxy, or a die attach film. Because the upper die 114 in the example of FIG. 1A is significantly larger than the lower die 14, and because the lower die 14 is to be electrically interconnected to the substrate 12 by wire bonding (not shown in this FIG.), the spacer 13 is required to provide clearance for the wire bond loops over the margins of the lower die. The height 11 between the downward-facing surface of the upper die 114 and the upward-facing surface of the substrate 12 is constituted by the thicknesses of the bottom die and the spacer, and the thicknesses of the various attach adhesives. The upper die 114 is much larger than the spacer 13 that the upper die is mounted upon, and large portions of the upper die project outward from the edges of the spacer, and overhang the edge of the lower die 14 and the substrate 12, as illustrated for example by die overhang 17.

FIG. 1B shows a detrimental effect that may result, for example, by impact of the wire bonding capillary with the die pads on the upper surface of an overhanging part of the second die during a wire bonding operation. Impact of the capillary tip 15 with the die pads on the overhanging part 117 of the die 116 may cause the overhanging part of the die to flex, as shown by the arrow 19 and bounce and/or to crack or break. Flex or bounce can result in poor wire bond interconnection to the die pads; and cracking or breakage of the die, as shown for example at 118, can destroy the circuitry on the die.

Figure 2A:
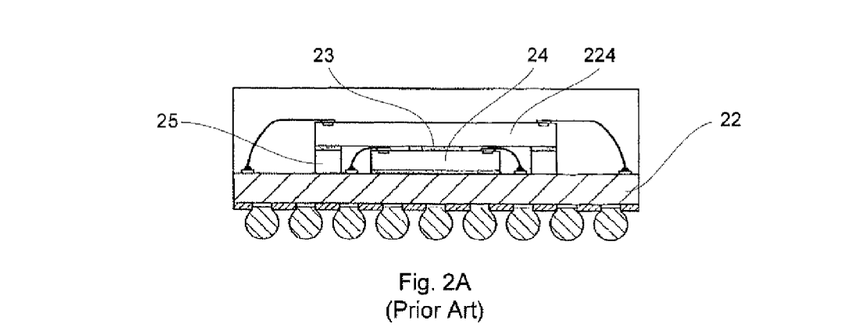
FIG. 2A is a diagrammatic sketch in a sectional view showing a stacked die package, in which overhanging portions of the upper die are supported in a conventional fashion by insulating spacers.
Figure 2B:
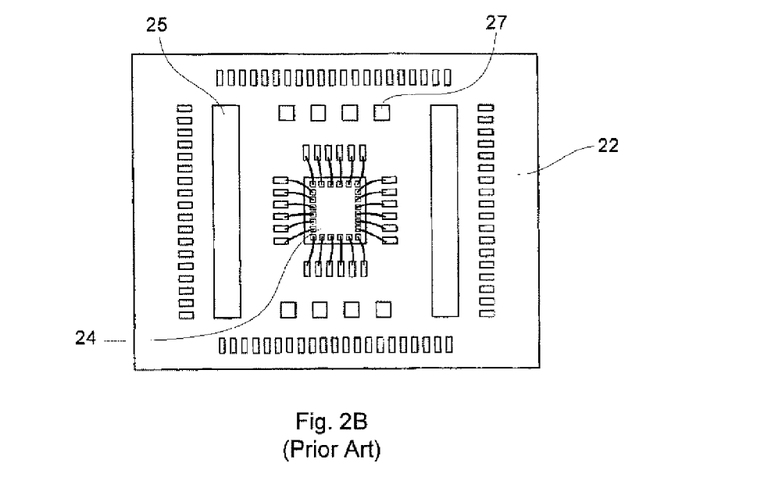
FIG. 2B is a diagrammatic sketch in a plan view showing a stage in the construction of the conventional package of FIG. 2A, before the upper die is mounted upon the lower die and insulating spacers.

FIGS. 2A and 2B illustrate a conventional approach to supporting an overhanging part of an upper die in a die stack, In this example a first ("lower") die 24 is affixed, active side upward, using an adhesive onto a die attach surface of a lower substrate 22, and the lower die is electrically connected to the substrate by wire bonds between pads on the die and wire bond sites on an metal layer in the upper layer of the substrate. Electrically insulating block- or bar-shaped spacers 25 are mounted, using an adhesive, upon the lower substrate outside the wire bond sites for interconnection of the lower die and parallel to rows of bond sites for electrical interconnection of the second ("upper") die 224. An insulating adhesive 23 is provided over the lower die and over the upward-facing surfaces of the spacers, and then the second ("upper") die 224 is then mounted upon the adhesive 23 on the lower die and the spacers, The adhesive 23 has a thickness that is sufficient when cured that to provide clearance above the lower die 24 for the loop height of the wire bonds, to avoid interference by the upper die 224 with the wire bonds, and the adhesive 23 may appropriately be referred to as a "spacer adhesive". Then the upper die is electrically interconnected to the substrate by wire bonding to the rows of wire bond pads outside the spacers. FIG. 2B shows stage in the construction of a package as in FIG. 3A, having a lower die 24 and spacers 25, 27 mounted on a substrate 22. The lower die 24 is electrically connected to the substrate 22 by wire bonds connecting pads on the die with bond fingers on the substrate. Spacers 25 and 27 are mounted on the substrate 22 outside (peripheral to) the bond fingers for interconnection of the lower die. Bond fingers for wire bond interconnection of the upper die (not yet placed in this FIG.) are situated outside (peripheral to) the spacers. A significant area of the substrate must be dedicated to the lower die wires, the lower die bond pads in the substrate, and to spacing among these features and between the wire bond sites and the spacers, as is evident in FIG. 2B. Typically, for example, a separation between the lower die bond pads and the space must be at least about 0.5-1.0 mm; and the width of the bond fingers is about 0.4 mm; and the wires themselves may be about 1 mm long.

Figure 3A:
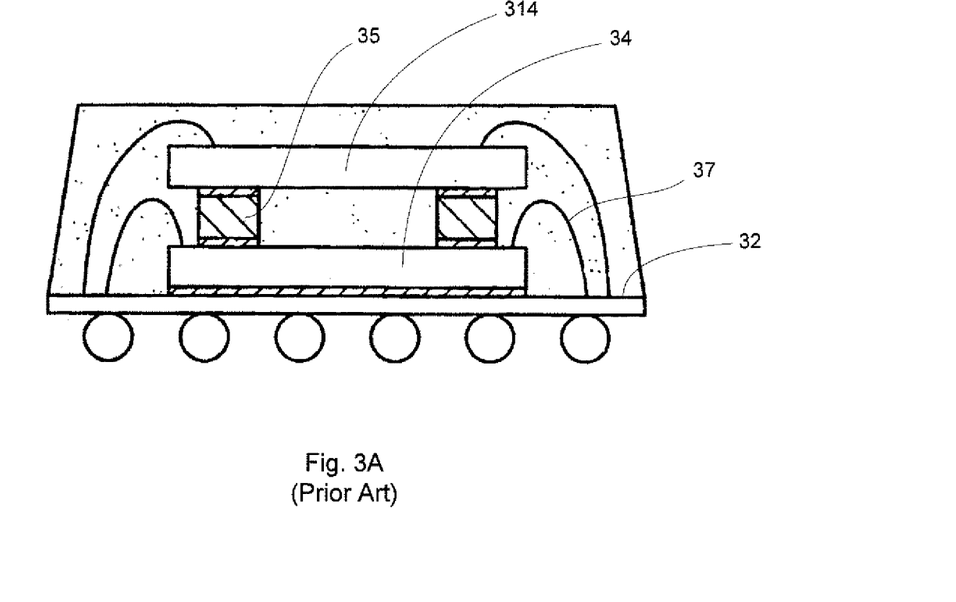
FIG. 3A is a diagrammatic sketch in a sectional view showing a stacked die package, having four spacers mounted on the lower die, and an upper die mounted on the spacers.
Figure 3B:
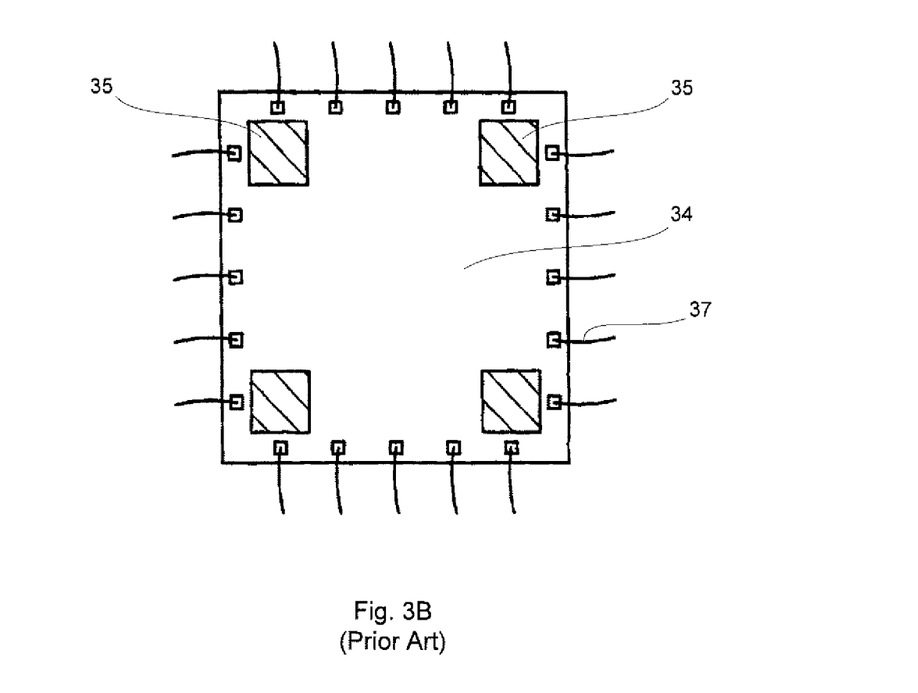
FIG. 3B is a diagrammatic sketch in a plan view showing a stage in the construction of the conventional package of FIG. 3A, before the upper die is mounted upon the four spacers.

FIGS. 3A and 3B illustrate another conventional approach to supporting an upper die over a lower die. Here the upper die 314 is about the same size as the lower die 34. In this approach, four smaller spacers 35 are affixed, using an adhesive, to the upward-facing (active) surface of the lower die 34, inboard from the die pads and near the corners of the die, as shown in FIG. 3B; and the upper die is affixed, using an adhesive, to the upward-facing surfaces of the small spacers, as shown in FIG. 3A. This arrangement would do nothing to help support a portion of the upper die that may extend over the substrate, in a case where the upper die is larger than the lower die.

Figure 4A:
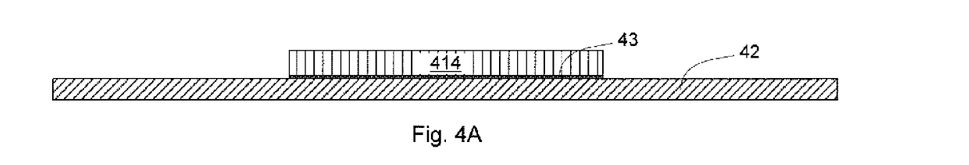
FIGS. 4A through 4F are sketches in a sectional view showing stages in the construction of a package according an embodiment to the invention, including bumps to support a stacked die configuration.
Figure 4B:
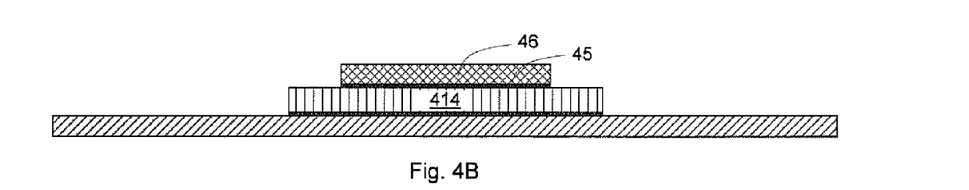
Figure 4C:
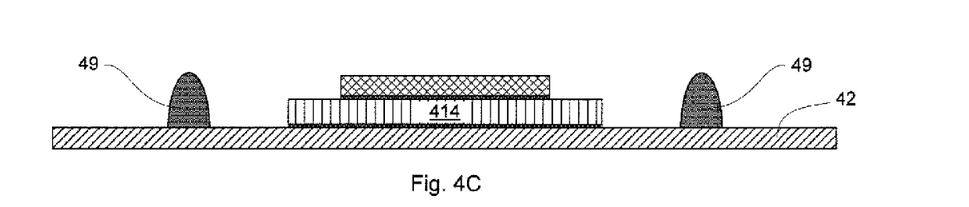
Figure 4D:
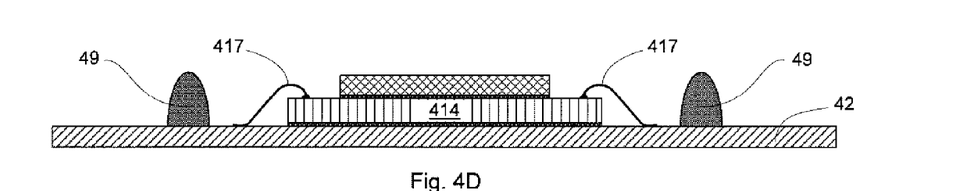
Figure 4E:
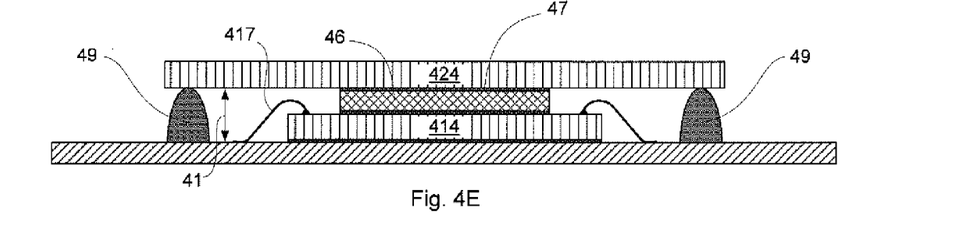
Figure 4F:
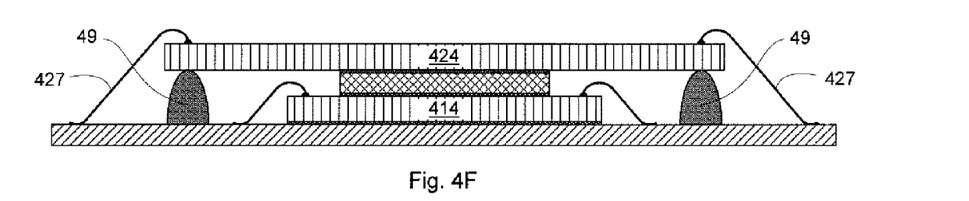

As illustrated in FIGS. 4A through 4F, support for an overhanging upper die or package is provided according to the invention by mounting a first die 414 using an adhesive 43 on a die attach region of the die attach side of the "bottom" substrate 42 (FIG. 4A), mounting a spacer 46 using an adhesive 45 on the first die 414 (FIG. 4B), depositing discrete epoxy bumps 49 on the die attach side of the "bottom" substrate 42 (FIG. 4C), interconnecting the first die 414 onto the bottom substrate 42 by wire bonds 417 connecting pads on the die 414 with bond sites on the substrate (FIG. 4D), and mounting the second die 424 (or "top" package) upon the spacer 46 using an adhesive 47 and upon the bumps 49 (FIG. 4E). The bumps 49 are dimensioned to support overhanging parts of the second die or "top" package at a clearance 41 between the upper surface of the "bottom" substrate and the under surface of the second die or "top" package. The dimension for the clearance 41 is determined as the sum of the thicknesses of the lower die 414 and the spacer 46, plus the thicknesses of the adhesives 43, 45, 47; as will be appreciated, the specifications for the bump height will be affected by the specifications for dimensional change, if any, in the adhesives during the curing process. Then the second die or "top" package is interconnected with the bottom substrate 42 by wire bonds 427 connecting pads on the second die 424 (or bond sites on the "top" package) with bond sites on the substrate, as shown in FIG. 4F, with the bumps 49 directly under the bond sites on the "top" package and positioned between the bond sites of the wire bonds 417 and the wire bonds 427 on the substrate 42. The sequence of steps may at some stages be different; particularly, for example, the steps giving rise to stages 4D and 4C can be reversed. In subsequent steps, the stacked die (or bottom die and top package), the spacer, the bumps, and the wire bond interconnects are encapsulated or molded.

Any of various substrate types may be suitable for the assembly ("bottom") substrate, providing only that the substrate have sites for electrical interconnection of the various electrical features mounted on and over it according to the invention. The assembly substrate may be, for example, a laminate with 2-6 metal layers, or a build up substrate with 4-8 metal layers, or a flexible polyimide tape with 1-2 metal layers, or a ceramic multilayer substrate. Or, for example, the substrate may be a lead frame.

Figure 5:
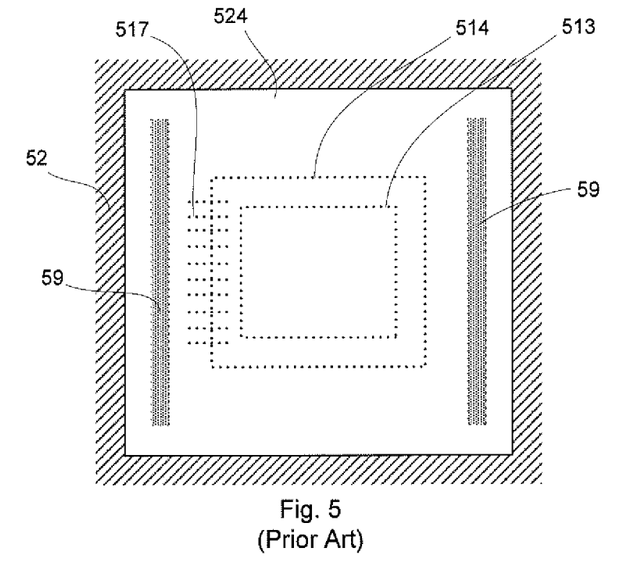
FIG. 5 is a diagrammatic sketch in a plan view showing the layout of structures on a conventional package as in FIG. 2B.
Figure 6:
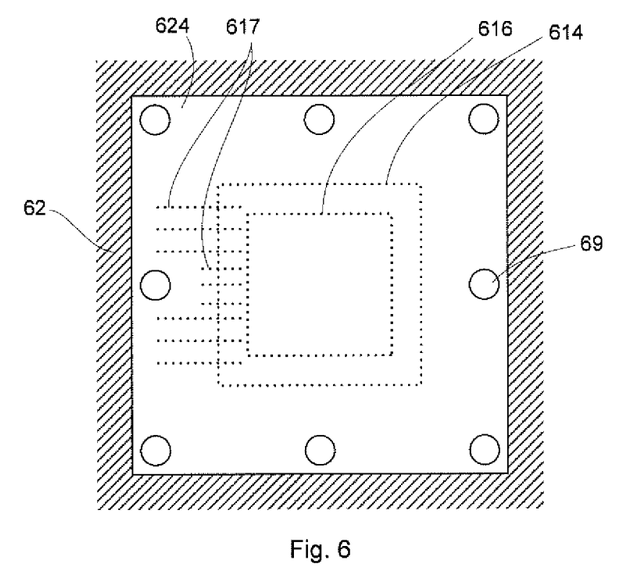
FIG. 6 is a diagrammatic sketch in a plan view showing the layout of structures on a package according an embodiment to the invention, as in FIG. 4A through 4F.

A comparison of a conventional configuration as in FIG. 2B with a configuration according to an embodiment of the invention as in FIG. 4F is made in FIGS. 5 and 6, each showing a plan view of an assembly having a first die mounted upon and electrically connected to a substrate, and a second die mounted over the first die. FIG. 5 shows a stage in construction of a conventional package as in FIG. 2B after the second die has been mounted, but before the second die has been electrically connected to the substrate by wire bonds. The second die 524 and a portion of the underlying substrate 52 are visible in this view. The first die 514, the die spacer adhesive 513, the first die wire bonds, e.g., 517, and the spacers 59 are shown by dotted or broken lines, as they are obscured in this view beneath the second die 524. FIG. 6 shows a stage in construction of a package according to an embodiment of the invention as in FIG. 4F after the second die has been mounted, but before the second die has been electrically connected to the substrate by wire bonds. An upper semiconductor part, such as the second die 624 and a portion of the underlying substrate 62 are visible in this view. A lower semiconductor part, such as the first die 614, the die spacer 616, the first die wire bonds, e.g., 617, and the spacers 69 are shown by dotted or broken lines, as they are obscured in this view beneath the second die 624. In this example, eight discrete epoxy bumps 69 are provided on the "bottom" substrate 62. The first die wire bonds 617 can be electrically bonded on die first bond sites and die second bond sites. The die first bond sites are between the epoxy bumps 69 and the first die 614 on the underlying substrate 62. The die second bond sites are extended farther away from the first die 614 than the die first bond sites. None of the epoxy bumps 69 are positioned between the die second bond sites and vertical edges of the substrate 620. The epoxy bumps 69 are in between the die second bond sites. The die second bond sites and the epoxy bumps 69 are located immediately adjacent to upper die bond sites on the underlying substrate 62, where the second die 624 or "top" package is electrically bonded on by wire bonds 427. The first die wire bonds 617 can include shorter wire bonds bonded on the die first bond sites and longer wire bonds bonded on the die second bond sites. The epoxy bumps 69 are positioned in between the long wire bonds. None of the epoxy bumps 69 are positioned in between the shorter wire bonds. The epoxy bumps 69 are arranged on the "bottom" substrate at the periphery of the second die footprint, to provide maximum support for the overhang. As FIG. 6 shows, the polymer bumps provide more free space on the substrate surface for arrangement of the wires and wire bond pads on the substrate. The choice of positions for the wire bond pads and the polymer support bumps can be adjusted according to particular design consideration for the particular die or package. Thus the package design can be more flexible.

Figure 7:
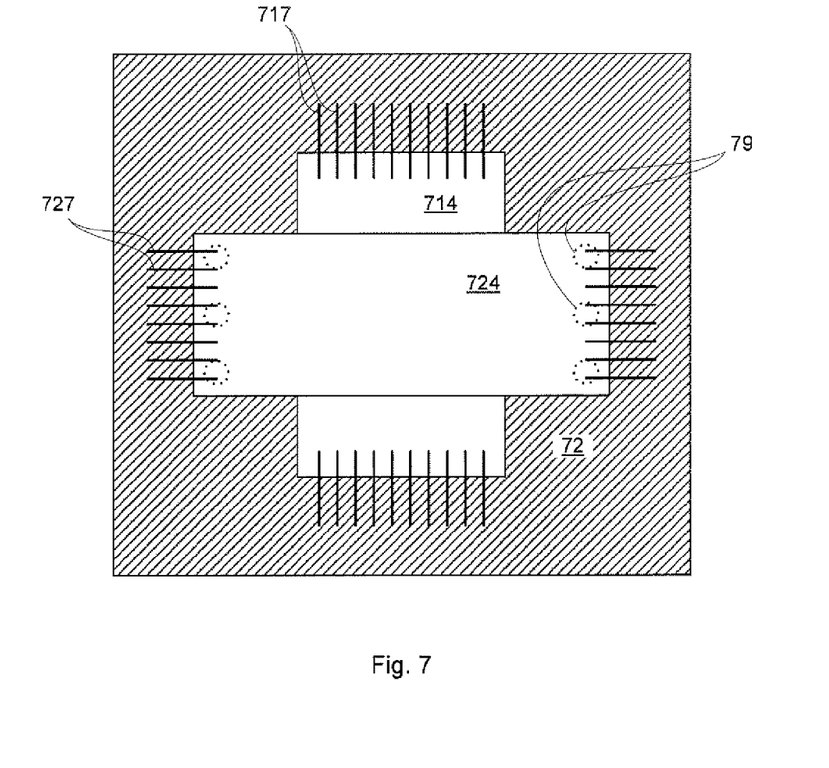
FIG. 7 is a diagrammatic sketch in a plan view showing stacked die including overhanging portions of an upper die, supported by polymer bumps according to an embodiment of the invention.

FIG. 7 shows an embodiment of the invention in which rectangular die are stacked, or a rectangular package is stacked over a rectangular die. Here the narrower dimension of the second ("top") die or package 724 is small enough so that-it can be accommodated in an area of the die that is inboard from the wire span areas of the first ("bottom") die 714. Accordingly they can be arranged so that no spacer is required between the die; epoxy bumps 79 on the "bottom" substrate 72 (obscured by the "top" die or package in this view) support an overhang 726 of the ends of the upper die. As one example of this configuration, the die may be electrically interconnected with the substrate bond sites (not shown) by wire bonds, e.g., 717, 727 connected to die pads arranged along one edge of the die, or (as in the example shown in the FIG.) along two opposite edges of the die. The epoxy bumps 79 are directly under a portion of the bond sites with overlapping of the bond sites directly over a portion of the epoxy bumps 79 to prevent flex, bounce, cracking, breaking, or tilt of the upper die or package resulting from wire bonding. The die may be memory die (of which some types are often rectangular, and significantly longer than wide). The lower die may be a flash memory, and the upper die may be a SRAM, for example; and the SRAM may be sufficiently narrow that no spacer is required between the two die. Nevertheless, because the second die (or package) is significantly longer than the width of the lower die, the significant overhang of the upper die (or package) must be supported over the underlying substrate, particularly where the upper die (or package) may be very thin and flexible, or to avoid tilt. The bottom die 714 is over the substrate 72. The epoxy bumps 79 are at an overhang side 728 of the overhang 726. The overhang side 728 is between opposite sides 730 of the bottom die 714. The overhang side 728 includes an overhang length 732 less than a die length 734 of the bottom die 714. The die length 734 extends between the opposite sides 730.

Figure 8:
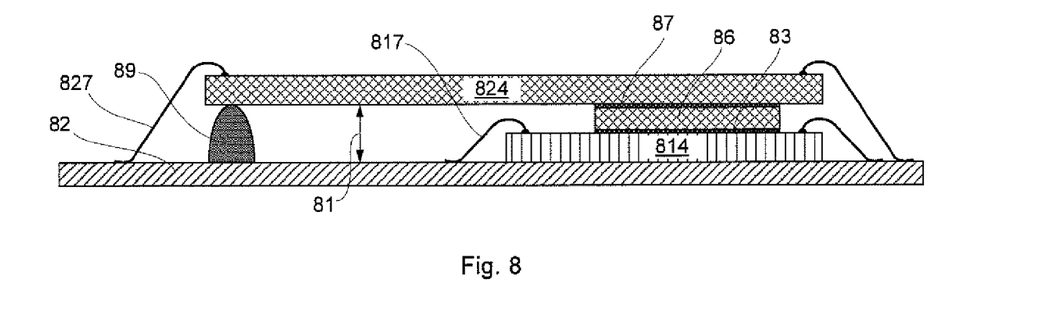
FIG. 8 is a diagrammatic sketch in a sectional view showing an arrangement of a die or package mounted on a spacer over a first die, having an extensive part overhanging the substrate, supported over the substrate by polymer bumps according to an embodiment of the invention.

FIG. 8 shows an embodiment in which an upper die or package 824 is asymmetrically stacked over a spacer 86 on the first ("lower") die 814. Epoxy bumps 89 on the "bottom" substrate 82 support the extensively overhanging (cantilevered) end of the upper die or package, preventing breakage (of a "top" die) or tilt (of a "top" die or package). The first ("bottom") die 814 is interconnected with the substrate 82 by wire bonds 817 connecting pads on the die with bond pads on the substrate; and the second ("top") die or package is interconnected by wire bonds 827 connecting pads on the die (or interconnect sites on the upper package substrate) with bond pads on the substrate 82. The spacer 86 is affixed to the bottom die 814 using an adhesive 83, and the second die or package 824 is affixed to the spacer 86 using an adhesive 87. The bumps 89 are dimensioned to provide a clearance 81 between the upper surface of the "bottom" substrate and the under surface of the second die or "top" package. The dimension for the clearance 81 is determined as the sum of the thicknesses of the lower die 814 and the spacer 86, plus the thicknesses of the adhesives 83, 87; as will be appreciated, the specifications for the bump height will be affected by the specifications for dimensional change, if any, in the adhesives during the curing process.

The material for the epoxy bumps may be applied using a syringe, for example, or other adhesive dispense tool; or, the bumps may be applied by printing and, in this approach, the bumps may preferably be applied prior to mounting the first die (and die spacer, where required). The polymer constituting the bumps may be a "filled" epoxy, for example, or an epoxy whose rheology and viscosity characteristics permit it to hold an attitude as a bump (without collapsing) until it can be cured to hardness. Typically the epoxy of the bumps is cured following mounting of the upper die or package, in a curing step that may additionally cure one or all of the attachment adhesives. An epoxy may be used that can be cured in stages; such an epoxy may be partially cured following bump formation but prior to mounting the second die or package, and then fully cured following mounting of the upper die or package, in a curing step that may additionally cure one or all of the attachment adhesives. A stage-curable epoxy may be preferred, as this may provide improved stability during assembly steps subsequent to forming the bumps.

Figure 9:
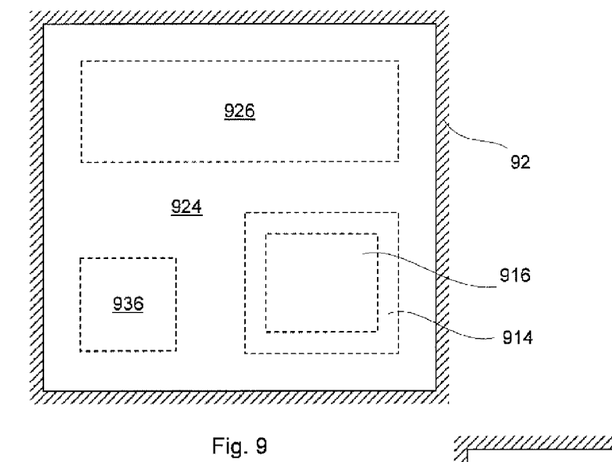
FIG. 9 is a diagrammatic sketch in a plan view showing the arrangement of a lower die and conventional spacers beneath an upper die or package.
Figures 10A, 10B:
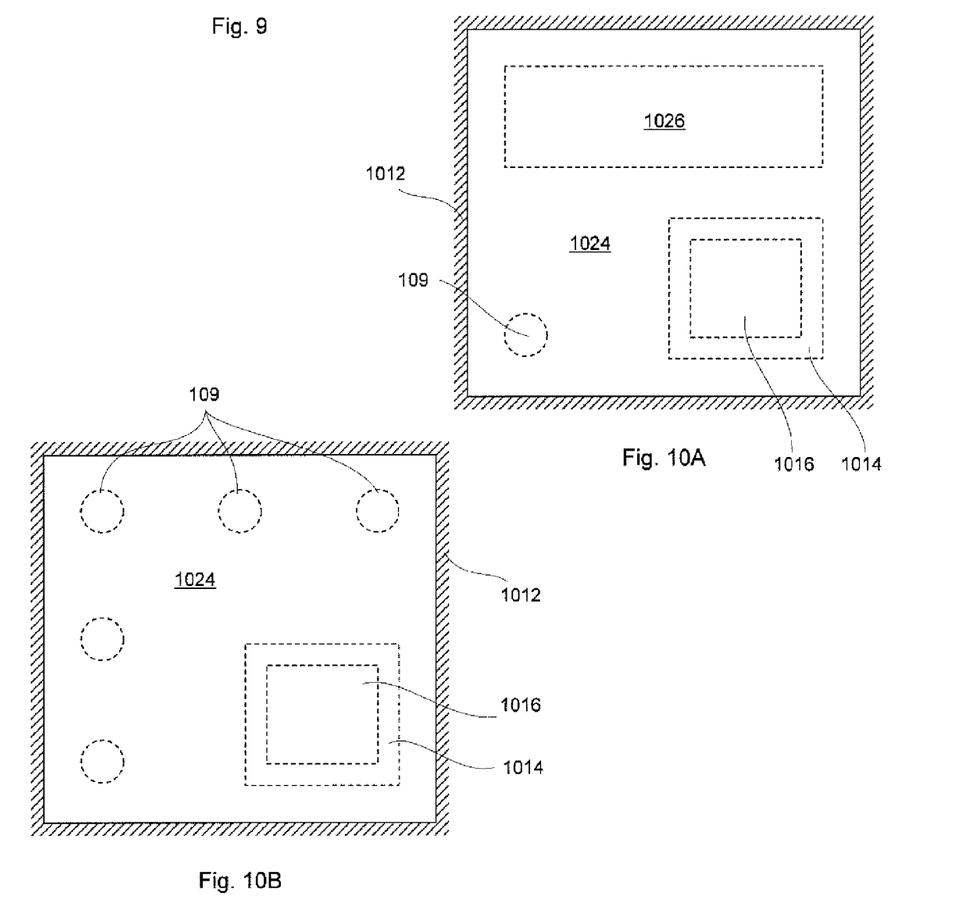
FIG. 10A is a diagrammatic sketch in a plan view showing the arrangement of a lower die, one conventional spacer, and a polymer bump spacer beneath an upper die or package according to an aspect of the invention.
FIG. 10B is a diagrammatic sketch in a plan view showing the arrangement of a lower die and several polymer bump spacers beneath an upper die or package according to an aspect of the invention.

Placement of the polymer support bumps is illustrated in particular examples in FIGS. 9 and 10A and 10B. In these examples, an upper die (or package) is to be stacked over a lower die; the lower die is provided with a die spacer so that the upper die or package does not interfere with the wire bonds connecting pads on the lower die with bond sites on the substrate. In the view shown in each of these FIGs., the second ("upper") die or package obscures all the features beneath it except a portion of the substrate that extends beyond the edge of the second die or package. Because the upper die or package is much larger than the lower die or package, in a conventional arrangement (FIG. 9), first 926 and second 936 spacers are required to support the extensive portions of the upper die 924 that extend beyond the lower die 914 spacer 916 and overhang the substrate 92. The clearance between the downward-facing side of the top die or package and the upward-facing side of the bottom substrate is determined by the thicknesses of the bottom die and the die spacer, plus the thicknesses of the adhesives by which the bottom die is attached to the substrate, the die spacer is attached to the bottom die, and the top die or package is attached to the die spacer; and the first and second spacers 926 and 936 are dimensioned, together with adhesives associated with them, to support the second die or package and to maintain the clearance of the second die or package over the substrate. In the configuration of FIG. 10A, a spacer 1026 is provided, but there is no second spacer; instead a polymer bump 109 according to the invention is employed to support the corner of the upper die or package 1024 that would conventionally (as in FIG. 9) have been supported by a second spacer; the clearance between the downward-facing side of the top package or substrate and the upward-facing side of the bottom substrate 1012 is determined by the thickness of the bottom die 1014 and the die spacer 1016 mounted on it, plus the thicknesses of the adhesives by which the bottom die is attached to the substrate, the die spacer is attached to the bottom die, and the top die or package is attached to the die spacer. In FIG. 10B, both the first spacer and the second spacer are absent, and five epoxy bumps 109 have been placed according to the invention so as to provide support in place of the spacers.

Other embodiments are within the invention.

In any of the configurations described above, the overhanging feature may be either a die or a package. Particularly, for example, in a multi-package module the upper feature may be a package having lands exposed on the upward-facing side of the upper package substrate, for wire bond interconnection to the substrate; the upper package may be inverted. Examples of multipackage modules having upper packages interconnected with the module by wire bonds are disclosed, for example, in Karnezos U.S. application Ser. No. 10/632,549, filed Aug. 2, 2003; and in Karnezos U.S. application Ser. No. 10/681,572, filed Oct. 8, 2003. Examples of multipackage modules having a stacked inverted package overhanging a module substrate are shown, for example, in Karnezos et al. U.S. application Ser. No. 10/022,375, filed Dec. 23, 2004. All patents and patent applications referenced herein are hereby incorporated herein by reference.

In any of the configurations described above, the lower die may be mounted onto the substrate by flip chip interconnect. In such embodiments the active side of the die faces the substrate, and interconnection is made by bumps or balls between die pads and interconnect sites on the substrate within the footprint of the die. No spacer over a flip chip lower die is necessary, inasmuch as there are no wire bonds between the die and the substrate, and the second feature may be mounted, using an adhesive, directly onto the first die. In such embodiments the clearance between the substrate and the stacked feature (that is, the height of the epoxy bumps supporting the overhanging part of the stacked feature) is determined by the thickness of the first die, together with the thickness of the interconnection (collapsed interconnect ball or bumps height) and the thickness of the adhesive by which the second feature is affixed to the first die.

Details of die structures or of package structures are omitted from the drawings for simplicity of presentation. Such structures would be well understood to the skilled artisan in light of the drawings and the description herein.

What is claimed is:

1. A semiconductor assembly comprising:
    a substrate;
    a die over the substrate, the die electrically bonded on die first bond sites and die second bond sites on the substrate by first die wire bonds, and the die second bond sites are extended farther away from the die than the die first bond sites;
    polymer bumps on the substrate, the polymer bumps are in between the die second bond sites, the polymer bumps are in between the die first bond sites and vertical edges of the substrate; and
    an upper die connected to upper die bond sites on the substrate, the upper die having an overhang supported over the substrate by the polymer bumps directly under a portion of bond sites on the overhang, wherein the polymer bumps are on the substrate between the die first bond sites and the upper die bond sites, the die second bond sites and the polymer bumps are immediately adjacent to the upper die bond sites.

2. A semiconductor assembly comprising:
    an assembly substrate;
    a first die over the assembly substrate, the first die electrically bonded on die first bond sites and die second bond sites on the assembly substrate by first die wire bonds, and the die second bond sites are extended farther away from the die than the die first bond sites;
    polymer bumps on the assembly substrate, the polymer bumps are in between the die second bond sites, the polymer bumps are in between the die first bond sites and vertical edges of the assembly substrate; and
    a semiconductor part connected to semiconductor part bond sites on the assembly substrate, the semiconductor part mounted in an elevated position in relation to the assembly substrate, wherein an overhang of the semiconductor part is supported by one or more of the polymer bumps directly under a portion of bond sites on the overhang, wherein the polymer bumps are on the assembly substrate between the die first bond sites and the semiconductor part bond sites, the die second bond sites and the polymer bumps are immediately adjacent to the semiconductor part bond sites.

3. The semiconductor assembly as claimed in claim 2 wherein the semiconductor part includes a semiconductor die.

4. The semiconductor assembly as claimed in claim 2 wherein the semiconductor part is a package die attached and electrically interconnected with a package substrate.

5. The semiconductor assembly as claimed in claim 3 wherein the semiconductor die is electrically interconnected to the assembly substrate by wire bonds.

6. The semiconductor assembly as claimed in claim 2 further comprising a package is electrically interconnected to the assembly substrate by wire bonds.

7. The semiconductor assembly as claimed in claim 2 wherein the first die is mounted on a die attach side of the assembly substrate and the semiconductor part is stacked over the first die.

8. The semiconductor assembly as claimed in claim 2 wherein the first die is affixed to a die mount region of a die attach side of the assembly substrate.

9. The semiconductor assembly as claimed in claim 2 further comprising a spacer between the first die and the semiconductor part.

10. The semiconductor assembly as claimed in claim 2 wherein the first die is mounted in a flip chip manner to a die mount region of a die attach side of the assembly substrate.

11. A method for making a semiconductor assembly, comprising:
    mounting a lower semiconductor part including a first die on a first side of an assembly substrate, the lower semiconductor part is electrically bonded on first semiconductor bond sites and second semiconductor bond sites on the assembly substrate by first semiconductor wire bonds, and the second semiconductor bond sites are extended farther away from the die than the first semiconductor bond sites;
    depositing discrete epoxy bumps on the first side of the assembly substrate in between the second semiconductor bond sites, the discrete epoxy bumps are in between the first semiconductor bond sites and vertical edges of the assembly substrate; and
    mounting an upper semiconductor part connected to upper semiconductor part bond sites on the assembly substrate, the upper semiconductor part bonded over the lower semiconductor part and on the discrete epoxy bumps, the upper semiconductor part having an overhang directly over a portion of the discrete epoxy bumps, wherein the discrete epoxy bumps are on the assembly substrate between the first semiconductor bond sites and the upper semiconductor part bond sites, the second semiconductor bond sites and the discrete epoxy bumps are immediately adjacent to the upper semiconductor part bond sites.

12. The method as claimed in claim 11 wherein the first wire bonds have different lengths.

13. The method as claimed in claim 11 wherein mounting the lower semiconductor part comprises forming a flip chip interconnection between a flip chip die and the assembly substrate.

14. The method as claimed in claim 11 wherein mounting the lower semiconductor part includes mounting a die.

15. The method as claimed in claim 11 further comprising, prior to mounting the upper semiconductor part, affixing a die spacer on the lower semiconductor part, and wherein mounting the upper semiconductor part includes affixing the upper semiconductor part on the die spacer.

16. The method as claimed in claim 11 wherein mounting the upper semiconductor part includes affixing a die onto a die spacer.

17. The method as claimed in claim 11 wherein mounting the upper semiconductor part includes affixing a semiconductor package onto a die spacer, the semiconductor package includes a package die affixed to a package substrate.

* * * * *